(12) United States Patent
Yager (10) Patent No.: US 9,868,641 B2
(45) Date of Patent: Jan. 16, 2018

(54) CONFORMING GRAPHENE TO A TARGET SUBSTRATE

(71) Applicant: EMPIRE TECHNOLOGY DEVELOPMENT LLC, Wilmington, DE (US)

(72) Inventor: Thomas A. Yager, Encinitas, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 15/071,067

(22) Filed: Mar. 15, 2016

(65) Prior Publication Data

US 2016/0194206 A1 Jul. 7, 2016

Related U.S. Application Data

(62) Division of application No. 13/319,038, filed as application No. PCT/US2011/032335 on Apr. 13, 2011, now abandoned.

(51) Int. Cl.

| | |
|---|---|
| *B44C 1/22* | (2006.01) |
| *C23F 1/00* | (2006.01) |
| *C03C 15/00* | (2006.01) |
| *C03C 25/68* | (2006.01) |
| *C25F 3/00* | (2006.01) |
| *C01B 31/04* | (2006.01) |
| *B82Y 30/00* | (2011.01) |
| *C23F 1/08* | (2006.01) |
| *C23C 16/26* | (2006.01) |
| *C23C 16/56* | (2006.01) |
| *B82Y 40/00* | (2011.01) |
| *C01B 32/186* | (2017.01) |
| *C01B 32/194* | (2017.01) |

(52) U.S. Cl.
CPC .......... *C01B 31/0453* (2013.01); *B82Y 30/00* (2013.01); *B82Y 40/00* (2013.01); *C01B 32/186* (2017.08); *C01B 32/194* (2017.08); *C23C 16/26* (2013.01); *C23C 16/56* (2013.01); *C23F 1/08* (2013.01)

(58) Field of Classification Search
CPC ................................................. C01B 31/0453
See application file for complete search history.

(56) References Cited

U.S. PATENT DOCUMENTS

| | | | |
|---|---|---|---|
| 3,989,566 A | * | 11/1976 | Egan ....................... H01L 21/67 |
| | | | 156/155 |
| 6,147,506 A | | 11/2000 | Ahmad et al. |
| 2002/0166633 A1 | | 11/2002 | Ryu et al. |
| 2009/0311166 A1 | | 12/2009 | Hart et al. |

(Continued)

FOREIGN PATENT DOCUMENTS

CN 101768012 A 7/2010

OTHER PUBLICATIONS

Reina et al., Large area, few-layer graphene films on arbitrary substrates by chemical vapor deposition, Nano Letters, 2009, pp. 30-35, vol. 9, No. 1, American Chemical Society.

(Continued)

*Primary Examiner* — Thomas Pham
(74) *Attorney, Agent, or Firm* — Turk IP Law, LLC (57) ABSTRACT

Implementations and techniques for conforming a layer of graphene to a target substrate are generally disclosed.

18 Claims, 9 Drawing Sheets

(56) References Cited

U.S. PATENT DOCUMENTS

| 2010/0012021 A1* | 1/2010 | Barker | B82Y 30/00 117/94 |
|---|---|---|---|
| 2010/0028559 A1 | 2/2010 | Yan et al. | |
| 2010/0143726 A1* | 6/2010 | Golzhauser | B05D 1/283 428/446 |
| 2010/0240222 A1 | 9/2010 | Fyten et al. | |
| 2010/0323164 A1* | 12/2010 | Ogihara | H01L 21/2007 428/156 |
| 2011/0171427 A1* | 7/2011 | Kim | B82Y 30/00 428/152 |

OTHER PUBLICATIONS

Xuesong et al., Transfer of large-area graphene films for high-performance transparent conductive electrodes, Nano Letters, 2009, pp. 4359-4363, vol. 9, No. 12, American Chemical Society.

Reina et al., Transferring and identification of single- and few-layer graphene on arbitrary substrates, Physical Chemistry Letters, 2008, pp. 17741-17744, vol. 112.

Australia Patent Office, International Search Report and Written Opinion of the International Searching Authority for PCT/US2011/032335, prepared on Jun. 6, 2011 and dated Jul. 18, 2011.

Romero, He., et al., n-Type behavior of graphene supported on Si/SiO2 substrates, ACS Nano, 2008, pp. 2037-2044, vol. 2, No. 10.

Watcharotone, Supinda, et al., Graphene-silica composite thin films as transparent conductors, Nano Letters, 2007, pp. 1888-1892, vol. 7, No. 7.

Moore, Tracy, et al., Transfer of graphene to alternative substrates, Abstracted Submitted for the MAR08 Meeting of be American Physical Society, accessed online on Aug. 17, 2011 at http://absimage.aps.org/image/MWS_MAROB-2007-006363.pdf.

Bae, Sukang, et al., Roll-to-roll production of 30-inch graphene films for transparent electrodes, Nature Nanotechnology Letters, published online Jun. 20, 2010, pp. 1-5, Macmillan Publishers Limited.

International Preliminary Report on Patentability for PCT/US2011/032335, dated Oct. 24, 2013.

* cited by examiner

```
PROVIDE A SHEET INCLUDING A LAYER OF GRAPHENE PORTION
AND A TRANSITION METAL SUBSTRATE PORTION
802
```

↓

```
COUPLE THE LAYER OF GRAPHENE PORTION TO A TARGET
SUBSTRATE
804
```

↓

```
REMOVE THE TRANSITION METAL SUBSTRATE PORTION

806
```

↓

```
CONFORM THE LAYER OF GRAPHENE TO THE TARGET
SUBSTRATE
808
```

1000 A computer program product.

1002 A signal bearing medium.

1004 Machine-readable instructions, which, if executed by one or more processors, operatively enable a computing device to:

coupling a layer of graphene portion of a sheet to a target substrate, where the sheet includes the layer of graphene portion and a transition metal substrate portion, where the layer of graphene portion is located on the transition metal substrate portion;

remove the transition metal substrate portion of the sheet from the layer of graphene portion of the sheet; and/or     conform the layer of graphene to the target substrate to form a graphene on target substrate assembly.

| 1006 a computer-readable medium. | 1008 a recordable medium. | 1010 a communications medium. |

CONFORMING GRAPHENE TO A TARGET SUBSTRATE

CROSS-REFERENCE TO RELATED APPLICATIONS

This application is a divisional application under 35 U.S.C. § 121 that claims priority under 35 U.S.C. § 120 to U.S. patent application Ser. No. 13/319,038 filed on Nov. 4, 2011, now abandoned, which in turn is a U.S. National Stage filing under 35 U.S.C. § 371 of International Application No. PCT/US2011/032335 filed on Apr. 13, 2011. The disclosures of the U.S. patent application and the International Application are hereby incorporated by reference in their entireties.

BACKGROUND

Unless otherwise indicated herein, the approaches described in this section are not prior art to the claims in this application and are not admitted to be prior art by inclusion in this section.

Some processes use an intermediate polymer film to transfer graphene from a transition metal substrate to a receiving substrate. In these processes, the graphene may be supported by three separate materials: the transition metal substrate, the intermediate polymer film, and the receiving substrate. The present disclosure appreciates that such polymer films may have poor mechanical stability compared to the transition metal substrate and the receiving substrate, and therefore may introduce defects into the graphene such as tears, folds, voids, contamination, etc.

SUMMARY

Some example methods, apparatus, and systems described herein may relate to conforming a layer of graphene to a target substrate.

Some example methods may include providing a sheet. Such a sheet may include a layer of graphene portion and a transition metal substrate portion. Such a layer of graphene portion may be located on the transition metal substrate portion. The layer of graphene portion of the sheet may be coupled to a target substrate. The transition metal substrate portion of the sheet may be removed from the layer of graphene portion of the sheet. The layer of graphene may be conformed to the target substrate to form a graphene on target substrate assembly based at least in part on applying hydrostatic pressure.

Some example apparatus and systems may relate to conforming a layer of graphene to a target substrate may include a housing and a permeable fabric. Such a housing may be configured to receive a target substrate and a sheet that includes a layer of graphene on a transition metal substrate. The housing may include a backing plate and/or a retaining ring. Such a backing plate may have a flat surface, where the flat surface may be configured to support the target substrate. Such a retaining ring may be removably coupled to the backing plate, where the retaining ring may be located in spaced alignment with the backing plate. Such a permeable fabric may be located within the housing adjacent the flat surface. The permeable fabric may be configured to pass etching solution therethrough to remove the transition metal substrate. The permeable fabric may be configured to not adhere to the layer of graphene under hydrostatic pressure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings.

DETAILED DESCRIPTION

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is generally drawn, inter alia, to methods, apparatus, and systems related to conforming a layer of graphene to a target substrate.

Large areas of graphene may be grown by chemical vapor deposition (CVD) to produce high quality graphene films with dimensions of thirty inches or greater. However, to take advantage of the unique electronic properties of graphene, it must be first transferred to insulating surfaces. Direct transfer from the transition metal substrate to an insulator could be accomplished by pressing the surfaces together, but this may not be successful due to rough surface finish (peaks and valleys) on the transition metal substrate introduced during the high temperature chemical vapor deposition (CVD) process, and the inability of the transition metal substrate to conform to the receiving surface of the target substrate. A process to transfer the graphene film directly from the transition metal substrate to the receiving insulating surface of a target substrate is discussed below that may reduce defects into the one-atom-thick graphene film.

Figure 1:
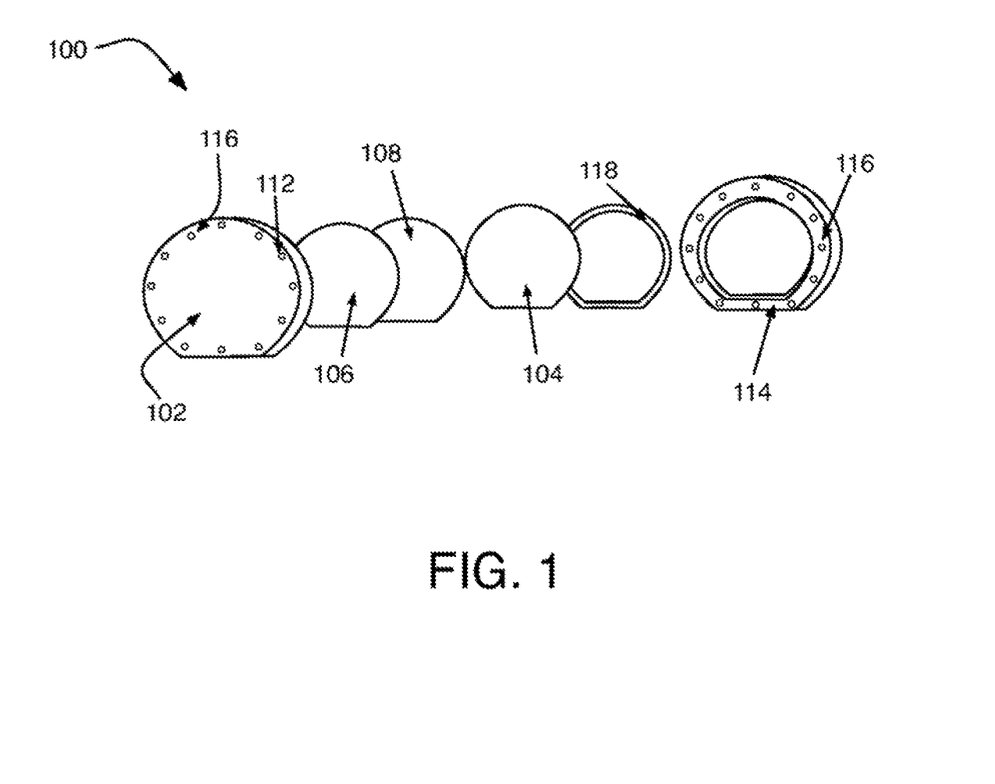
FIG. 1 is an illustration of an exploded view of an example assembly for conforming a layer of graphene to a target substrate.

FIG. 1 is an illustration of an exploded view of an example assembly 100 for conforming a layer of graphene to a target substrate that is arranged in accordance with at least some embodiments of the present disclosure. In the illustrated example, assembly 100 may include a housing 102 and a permeable fabric 104.

Housing 102 may be configured to receive a target substrate 106 and a sheet 108, where sheet 108 may include a layer of graphene on a transition metal substrate. In some examples, housing 102 may include a backing plate 112 and/or a retaining ring 114. Backing plate 112 and/or a retaining ring 114 may be formed of material resistant to etching solution, such as stainless steel or the like, for example. Such a backing plate 112 may have a flat surface (as will be discussed in greater detail below with regard to FIG. 6), where the flat surface may be configured to support target substrate 106.

In some examples, retaining ring 114 may be removably coupled to backing plate 112, where retaining ring 114 may be located in spaced alignment with backing plate 112 when housing 102 is assembled. In the illustrated example, backing plate 112 and/or retaining ring 114 may include corresponding apertures 116 that may align between backing plate 112 and retaining ring 114. Such apertures 116 may mate with and/or receive one or more fasteners (as will be discussed in greater detail below with regard to FIG. 6).

In some examples, permeable fabric 104 may be located within housing 102. Permeable fabric 104 may be configured to pass etching solution therethrough to remove the transition metal substrate portion of sheet 108. Permeable fabric 104 may be configured to not adhere to the layer of graphene portion of sheet 108 under hydrostatic pressure. As used herein, the term "hydrostatic pressure" may refer to pressure induced via fluids or gasses (e.g., via isostatic presses, or the like).

A sealing ring 118 may be located between retaining ring 114 and permeable fabric 104. Sealing ring 118 may be configured to improve a seal between retaining ring 114 and permeable fabric 104.

In operation, assembly 100 may be utilized to remove the transition metal substrate portion of sheet 108 and then conform the layer of graphene portion of sheet 108 to target substrate 106. The operation of assembly 100 will be described in greater detail below.

Figure 2:
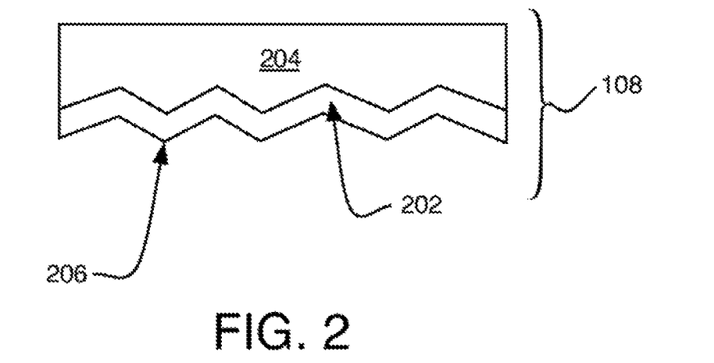
FIG. 2 is an illustration of a side view of an example sheet including a layer of graphene portion and a transition metal substrate portion at a given stage of processing.

FIG. 2 is an illustration of a side view of an example sheet 108 at a given stage of processing, which is arranged in accordance with at least some embodiments of the present disclosure. In the illustrated example, sheet 108 may include a layer of graphene 202 portion and a transition metal substrate 204 portion. Such a layer of graphene 202 may be located on transition metal substrate 204. Local extremities 206 either of the transition metal substrate 202 (which may in turn prevent the layer of graphene 202 from laying substantially smooth) or the target substrate 106 may occur where the surface is slightly uneven.

Transition metal substrate 204 may include one or more of the following substances: copper, nickel, iron, cobalt, platinum, iridium, ruthenium, the like, and/or combinations thereof. In some examples, large areas of graphene may be grown by chemical vapor deposition (CVD) on the transition metal substrate. Other processes, besides CVD, may be used to grow graphene films on the transition metal substrate. Such large areas of graphene may be grown by chemical vapor deposition (CVD) to produce high quality graphene films with dimensions of thirty inches or more, for example.

Figure 3:
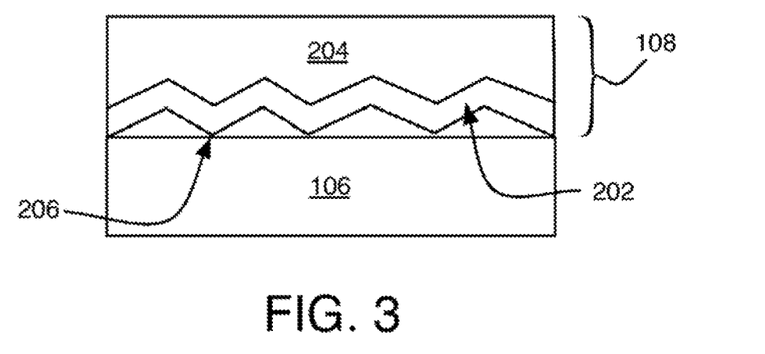
FIG. 3 is an illustration of a side view of an example sheet coupled to a target substrate at a given stage of processing.

FIG. 3 is an illustration of a side view of an example sheet 108 coupled to a target substrate at a given stage of processing, which is arranged in accordance with at least some embodiments of the present disclosure. In the illustrated example, sheet 108 may be coupled to target substrate 106.

For example, local extremities 206 of either the transition metal substrate 202 or the target substrate 106 may be coupled with graphene between them. In such an example, Van der Waals forces may operate at the points (e.g., local extremities 206) where layer of graphene 202 touches target substrate 106 to hold layer of graphene 202 stably against target substrate 106. Accordingly, layer of graphene 202 may be substantially held to target substrate 106 via such local extremities 206 without necessarily being fully conformed to target substrate 106.

Target substrate 106 may include one or more of the following substances: a silicon dioxide based semiconductor, glass, quartz, rigid polymer material, flexible polymer material, the like, and/or combinations thereof. In some examples, transition metal substrate 204 and/or sheet 108 may have a diameter larger than that of target substrate 106 to reduce potential problems and defects at the edges of transition metal substrate 204 and/or sheet 108.

Figure 4:
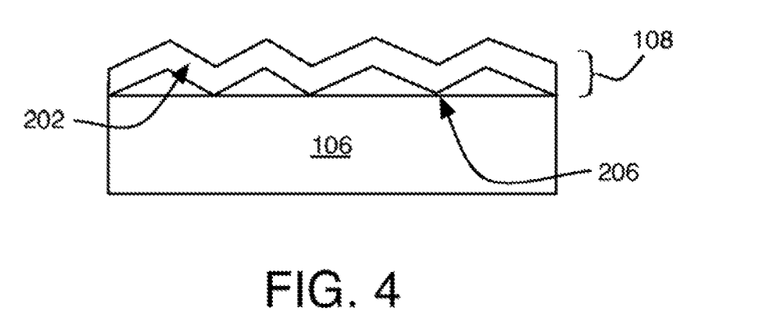
FIG. 4 is an illustration of a side view of an example sheet coupled to a target substrate at a given stage of processing, where the transition metal substrate portion of the sheet has been removed.

FIG. 4 is an illustration of a side view of an example sheet 108 coupled to a target substrate at a given stage of processing, where the transition metal substrate portion of the sheet has been removed, which is arranged in accordance with at least some embodiments of the present disclosure. In the illustrated example, transition metal substrate portion (not shown) of sheet 108 has been removed. The layer of graphene 202 portion of sheet 108 may remain coupled to target substrate 106 after the removal of the transition metal substrate portion of sheet 108 from the layer of graphene 202 portion of sheet 108.

Figure 5:
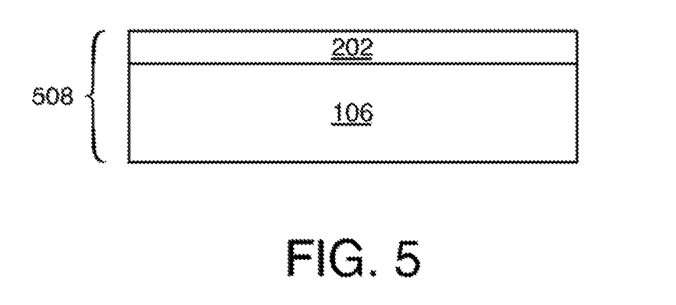
FIG. 5 is an illustration of a side view of an example graphene on target substrate assembly at a given stage of processing.

FIG. 5 is an illustration of a side view of an example graphene on target substrate assembly at a given stage of processing, which is arranged in accordance with at least some embodiments of the present disclosure. In the illustrated example, a graphene on target substrate assembly 508 may be formed. For example, layer of graphene 202 may be conformed to target substrate 106 to form graphene on target substrate assembly 508 based at least in part on applying hydrostatic pressure. Accordingly, layer of graphene 202, previously held to target substrate 106 primarily via local extremities 206 (see FIG. 4), may be substantially conformed to target substrate 106, substantially reducing or eliminating such local extremities.

Figure 6:
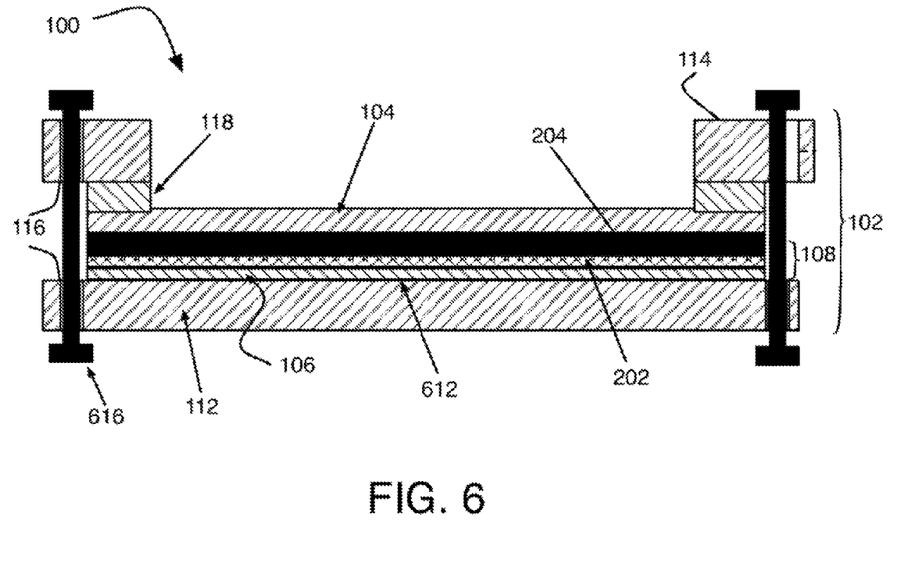
FIG. 6 is an illustration of a cross-sectional side view of an example assembly for conforming a layer of graphene to a target substrate at a given stage of processing.

FIG. 6 is an illustration of a cross-sectional side view of an example assembly 100 for conforming a layer of graphene to a target substrate at a given stage of processing, which is arranged in accordance with at least some embodiments of the present disclosure. In the illustrated example, housing 102 may be configured to receive target substrate 106 and sheet 108, where sheet 108 may include layer of graphene 202 portion on transition metal substrate 204 portion. For example, housing 102 may include backing plate 112 and/or a retaining ring 114, where backing plate 112 may have a flat surface 612. Such a flat surface 612 may be configured to support target substrate 106.

As discussed above, in some examples, retaining ring 114 may be removably coupled to backing plate 112, where retaining ring 114 may be located in spaced alignment with backing plate 112. As used herein the term "spaced alignment" may refer an orientation between two or more objects, where such objects may be located apart from one another while being located in generally parallel planes, for example. In the illustrated example, backing plate 112 and/or retaining ring 114 may include corresponding apertures 116 that may be adapted to align between backing plate 112 and retaining ring 114. Such apertures 116 may be adapted to mate with and/or receive one or more fasteners 616. Such fasteners 616 may be configured to removably couple retaining ring 114 to backing plate 112. Permeable fabric 104 may be located within housing 102 adjacent flat surface 612 of backing plate 112.

Additionally or alternatively, assembly 100 may include one or more biasing mechanisms that may be configured to bias retaining ring 114 and backing plate 112 together. In some examples, such biasing mechanisms may be embodied by fasteners 616, such as where fasteners 616 may be configured to bias retaining ring 114 and backing plate 112 together. In other examples, one or more biasing mechanisms may be provided separately from such fasteners 616. For example, such biasing mechanisms might include c-shaped spring clamps (not shown), which may be provided separately from such fasteners 616, and may be positioned on the exterior surfaces of retaining ring 114 and backing plate 112. In either case, biasing forces may be provided via springs, elastic devices, tensioning devices, the like, and/or combinations thereof.

In operation, assembly 100 may be utilized to remove transition metal substrate 204 portion of sheet 108 prior to conforming layer of graphene 202 portion of sheet 108 to target substrate 106. For example, permeable fabric 104 may be configured to pass etching solution therethrough to remove transition metal substrate 204 portion of sheet 108. Such etching solution may include iron nitrate, ferric chloride, the like, and/or combinations thereof. Such etching processes may include chemical or electrochemical etching.

Figure 7:
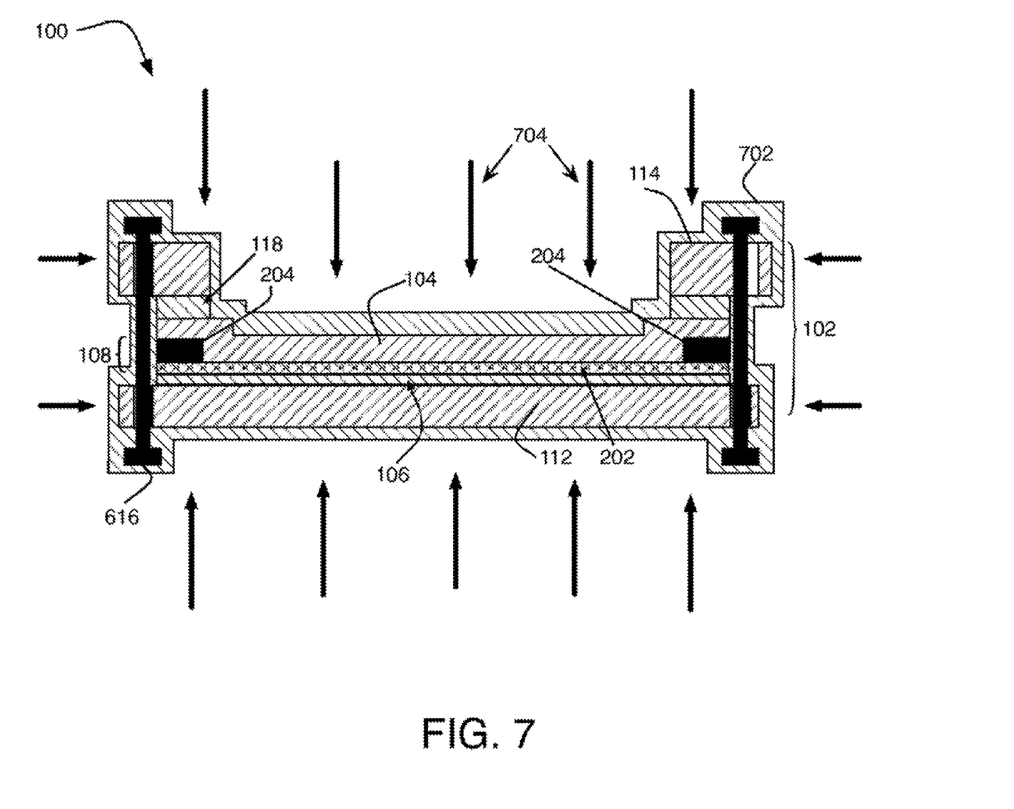
FIG. 7 is an illustration of a cross-sectional side view of an example assembly for conforming a layer of graphene to a target substrate at a given stage of processing.

FIG. 7 is an illustration of a cross-sectional side view of an example assembly 100 for conforming a layer of graphene to a target substrate at a given stage of processing, which is arranged in accordance with at least some embodiments of the present disclosure. In the illustrated example, housing 102 may be sealed via a conforming elastomeric coating 702 or the like. Conforming elastomeric coating 702 may include a latex-type film, polyurethane-type film, the like, and/or combinations thereof.

For example, housing 102 may be sealed via conforming elastomeric coating 702 after transition metal substrate 204 portion of sheet 108 has been removed and before conforming layer of graphene 202 to target substrate 106. Transition metal substrate 204 may be partially removed, as is illustrated here, or may be completely removed from sheet 108.

Conforming elastomeric coating 702 may be capable of protecting target substrate 106 from fluids located outside of housing 102. In some embodiments, conforming elastomeric coating 702 may be eliminated. For example, in instances where layer of graphene 202 is substantially defect free (e.g., a continuous and void free graphene film), layer of graphene 202 may be utilized to protect target substrate 106 from fluids located outside of housing 102. Additionally or alternatively, in instances where layer of graphene 202 is substantially defect free it also may be possible to remove transition metal substrate 204 and conform layer of graphene 202 to target substrate 106 without the use of solution permeable cloth 104 and/or housing 102.

For proper transfer, layer of graphene 202 may adhere more strongly to target substrate 106 than to solution permeable cloth 104. For example, although layer of graphene 202 may touch solution permeable cloth 104, layer of graphene 202 may not adhere to solution permeable cloth 104 and may not be mechanically supported by solution permeable cloth 104. Solution permeable cloth 104 may include a weave of Teflon® fibers, since Teflon® does not adhere to graphene and would allow solution to flow therethrough with large enough pores. Other materials that do not adhere to graphene might also work as an alternative to Teflon®. In some examples, solution permeable cloth 104 may be formulated so that solution permeable cloth 104 does not absorb water and/or etching solution, and could be a coarse mesh.

In some embodiments, solution permeable cloth 104 may be optionally excluded. In such an example, removal of transition metal substrate 204 may be done without solution permeable cloth 104. For example, after removal of transition metal substrate 204, a piece of release paper (e.g., a paper coated with Teflon or other non-stick substance) may be placed adjacent to layer of graphene 202 to shield layer of graphene 202 from conforming elastomeric coating 702.

In operation, assembly 100 may be utilized to transfer external hydrostatic pressure (illustrated via arrows 704) to layer of graphene 202 portion of sheet 108. Under such hydrostatic pressure, layer of graphene 202 portion of sheet 108 may be conformed to target substrate 106. Permeable fabric 104 may be configured to not adhere to layer of graphene 202 portion of sheet 108 under such hydrostatic pressure.

Figure 8:
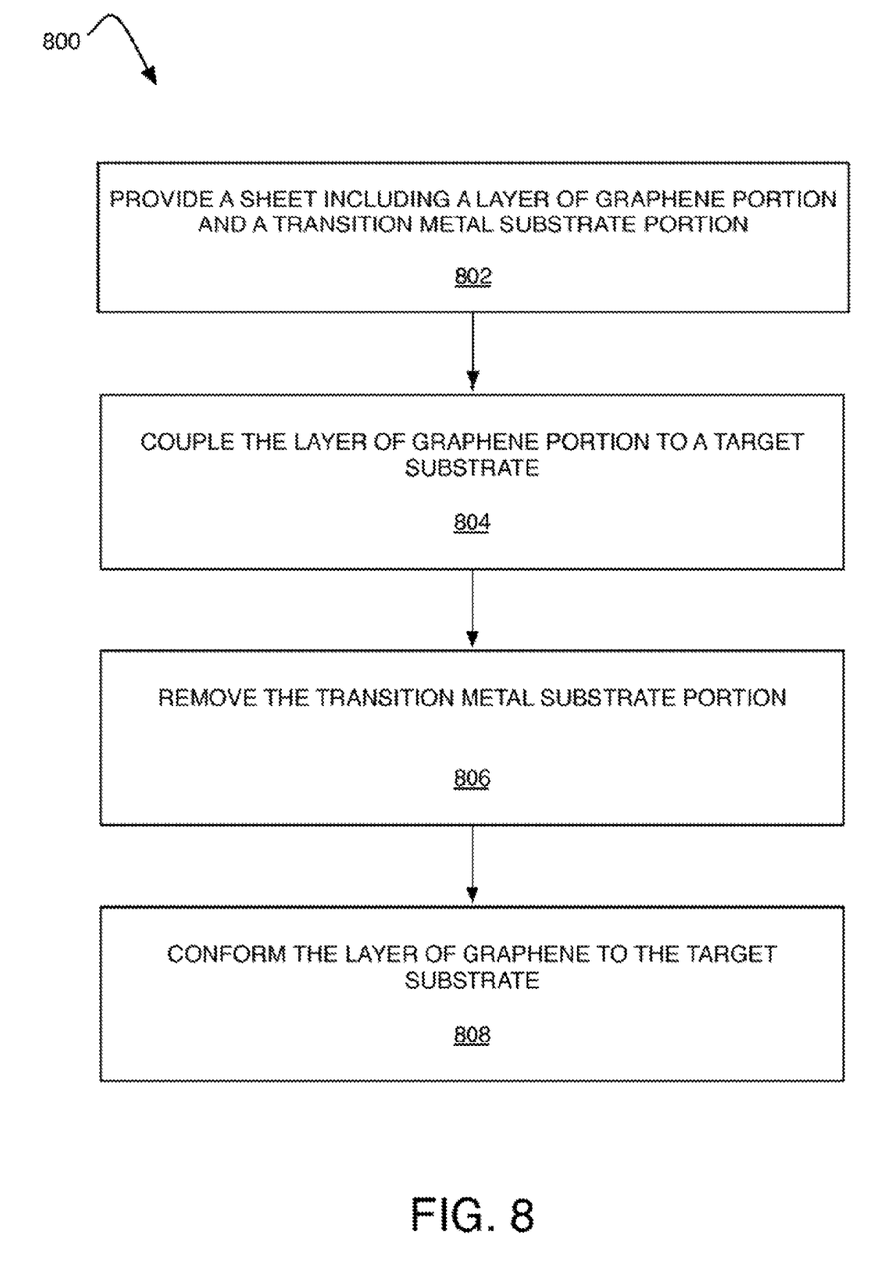
FIG. 8 is an illustration of an example process for conforming a layer of graphene to a target substrate.

FIG. 8 is an illustration of an example process for conforming a layer of graphene to a target substrate, which is arranged in accordance with at least some embodiments of the present disclosure. In the illustrated example, process 800, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 8 may be practiced in various implementations. For example, although process 800, as shown in FIG. 8, comprises one particular order of blocks or actions, the order in which these blocks or actions are presented does not necessarily limit claimed subject matter to any particular order. Likewise, intervening actions not shown in FIG. 8 and/or additional actions not shown in FIG. 8 may be employed and/or some of the actions shown in FIG. 8 may be eliminated, without departing from the scope of claimed subject matter. Process 800 may include one or more of operations as illustrated by blocks 802, 804, 806, and/or 808.

As illustrated, process 800 may be implemented to conforming a layer of graphene to a target substrate. Processing may begin at operation 802, "PROVIDE A SHEET INCLUDING A LAYER OF GRAPHENE PORTION AND A TRANSITION METAL SUBSTRATE PORTION", where a sheet including a layer of graphene portion and a transition metal substrate portion may be provided. Single layer graphene may be formed on transition metal substrates using chemical vapor deposition (CVD) of Methane and Hydrogen at 1000° C., for example. For example, such a sheet may include a layer of graphene portion and a transition metal substrate portion. Such a layer of graphene may be located on the transition metal substrate.

Processing may continue from operation 802 to operation 804, "COUPLE THE LAYER OF GRAPHENE PORTION TO A TARGET SUBSTRATE", where the layer of graphene may be coupled to the target substrate. For example, the layer of graphene portion of the sheet may be pressed against the target substrate to couple the layer of graphene portion to the target substrate via Van der Waals forces at the points where the layer of graphene touches the target substrate. In one example, during the assembly process of a fixture (e.g. housing 102 illustrated in FIG. 1), the layer of graphene may be pressed against the target substrate as the fixture is assembled and tightened.

Processing may continue from operation 804 to operation 806, "REMOVE THE TRANSITION METAL SUBSTRATE PORTION", where the transition metal substrate portion may be removed from the sheet. For example, the transition metal substrate portion of the sheet may be removed from the layer of graphene portion of the sheet via etching. Etching may occur in either a vessel containing the etching solution, or may be biased where a cathode is placed in the etching solution and the transition metal is given a positive charge, for example.

Processing may continue from operation 806 to operation 808, "CONFORM THE LAYER OF GRAPHENE TO TARGET SUBSTRATE", where the layer of graphene may be conformed to the target substrate. For example, the layer of graphene may be conformed to the target substrate to form a graphene on target substrate assembly based at least in part on applying hydrostatic pressure. As used herein, the term "hydrostatic pressure" may refer to pressure induced via fluids or gasses (e.g., via isostatic presses, or the like). In one example, such hydrostatic pressure may be applied via a high-hydrostatic pressure vessel or the like.

In operation, process 800 may transfer the layer of graphene to the target substrate by dissolving away the transition metal substrate and using hydrostatic pressure to form a substantially conforming bond between the layer of graphene and the target substrate. This technique may eliminate using an intermediate polymer transfer film to transfer the layer of graphene from the transition metal substrate to the target substrate.

Figure 9:
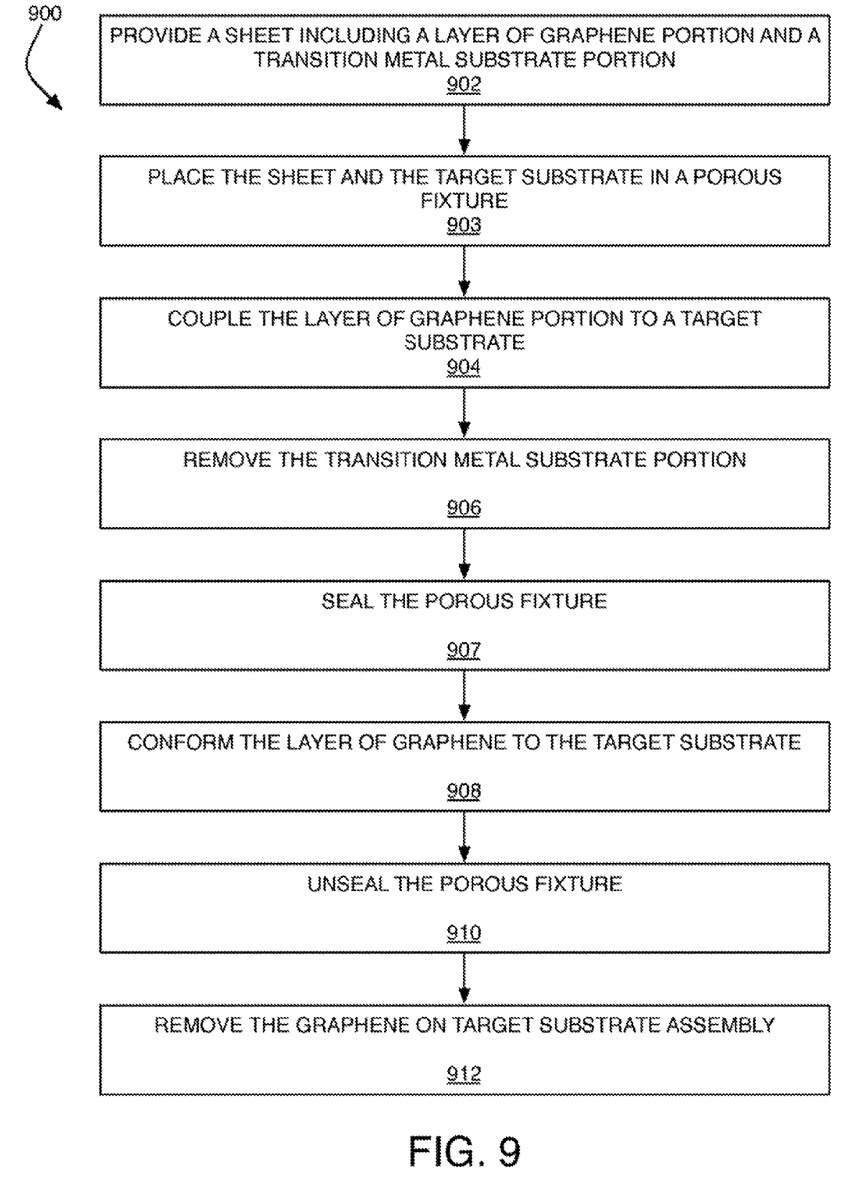
FIG. 9 is an illustration of another example process for conforming a layer of graphene to a target substrate.

FIG. 9 is an illustration of another example process for conforming a layer of graphene to a target substrate, which is arranged in accordance with at least some embodiments of the present disclosure. In the illustrated example, process 900 may include one or more of functional operations as indicated by example operations 902, 903, 904, 906, 907, 908, 910, and/or 912.

As illustrated, process 900 may be implemented to conforming a layer of graphene to a target substrate. Processing may begin at operation 902, "PROVIDE A SHEET INCLUDING A LAYER OF GRAPHENE PORTION AND A TRANSITION METAL SUBSTRATE PORTION", where a sheet including a layer of graphene portion and a transition metal substrate portion may be provided. As discussed above with respect to process 800, in some examples, such a sheet may include a layer of graphene portion and a transition metal substrate portion. Such a layer of graphene may be located on the transition metal substrate.

Processing may continue from operation 902 to operation 903, "PLACE THE SHEET AND THE TARGET SUBSTRATE IN A POROUS FIXTURE", where the sheet and the target substrate may be placed in a porous fixture. As used herein, the term "porous fixture" may refer to any device that is capable of receiving the target substrate and the sheet, passing etching solution to remove the transition metal substrate from the layer of graphene, and/or holding the target substrate and layer of graphene during the conforming of the layer of graphene to the target substrate (e.g., housing 102 illustrated in FIG. 1, or the like). For example, the sheet and the target substrate may be placed in a porous fixture (e.g., housing 102 illustrated in FIG. 1) prior to removal of the transition metal substrate. In some examples, the porous fixture may be loosely assembled (e.g., as illustrated in FIG. 6), and evacuated to eliminate any trapped air between the layer of graphene and the target substrate. The porous fixture may then be closed. The placing of the sheet and the target substrate may be performed manually or be automated (e.g., via robotic arms or the like), for example.

Processing may continue from operation 903 to operation 904, "COUPLE THE LAYER OF GRAPHENE PORTION TO A TARGET SUBSTRATE", where the layer of graphene may be coupled to the target substrate. As discussed above with respect to process 800, in some examples, the layer of graphene portion of the sheet may be pressed against the target substrate to couple the layer of graphene portion to the target substrate via Van der Waals forces at the surface extremities where the layer of graphene touches the target substrate. In this process, such Van der Waals forces may bond the layer of graphene at these surface extremities to the target substrate, providing structural support, without the layer of graphene fully conforming to the target substrate. In some examples, such pressing to couple the layer of graphene portion to the target substrate may be based at least in part on forces related to assembling and/or closing the porous fixture.

Processing may continue from operation 904 to operation 906, "REMOVE THE TRANSITION METAL SUBSTRATE PORTION", where the transition metal substrate portion may be removed from the sheet. As discussed above with respect to process 800, in some examples, the transition metal substrate portion of the sheet may be removed from the layer of graphene portion of the sheet via etching solution. For example, etching solution may be received through a solution permeable cover portion (e.g., permeable fabric 104 illustrated in FIG. 1) of the porous fixture while the sheet and the target substrate are located in the porous fixture. After removal of the transition metal substrate, the porous fixture may be rinsed to remove the etching solution.

Additionally or alternatively, the transition metal substrate portion of the sheet may be removed from the layer of graphene portion of the sheet electrochemically. For example, a cathode may be placed in the etching solution and the transition metal substrate may be given a positive charge via the cathode. Such electrochemical etching might permit the removal of the transition metal substrate with minimal agitation. During this step, the solution permeable cover may allow transition metal ions to pass into the etching solution, while providing some mechanical protection for the layer of graphene.

Processing may continue from operation 906 to operation 907, "SEAL THE POROUS FIXTURE", where the porous fixture may be sealed. For example, the porous fixture may be sealed via a conforming elastomeric coating. In some examples, the porous fixture may be sealed by placing an elastomeric bag over the entire porous fixture, making sure there are no wrinkles on the layer of graphene; by coating the porous fixture with a liquid elastomeric film followed by a cure step; or the like. In some examples, the conforming elastomeric coating may never touch the layer of graphene and may be removed at a later process step without contaminating the layer of graphene. The application of the conforming elastomeric coating may be performed chemically (e.g., via a chemical bath), manually (e.g., manually placing an elastomeric bag over the entire porous fixture), or by an automated application (e.g., via robotic arms or the like placing an elastomeric bag over the entire porous fixture), for example.

Processing may continue from operation 907 to operation 908, "CONFORM THE LAYER OF GRAPHENE TO THE TARGET SUBSTRATE", where the layer of graphene may be conformed to the target substrate. As discussed above with respect to process 800, in some examples, the layer of graphene may be conformed to the target substrate to form a graphene on target substrate assembly based at least in part on applying hydrostatic pressure. In some examples, the removal of the transition metal substrate and/or the conforming of the layer of graphene to the target substrate may be performed while the sheet and the target substrate are located in the porous fixture.

In some examples, the porous fixture may be placed in a hydrostatic press. The fluid of the hydrostatic press may apply uniform pressure over the entire area of the porous fixture and the layer of graphene, where the conforming elastomeric coating may protect the porous fixture and/or the layer of graphene from the fluid. At this point, the layer of graphene may conform substantially uniformly across the receiving surface of the target substrate, and may receive the same pressure everywhere. Various pressures may be used, such as a pressure greater or equal to about 0.5 mega Pascal (MPa) as just one example. Additionally, elevated or reduced temperatures may optionally be used to facilitate such conforming; however, some temperatures may not be available depending on the fluid used.

Processing may continue from operation 908 to operation 910, "UNSEAL THE POROUS FIXTURE", where the porous fixture may be unsealed. For example, the porous fixture may be unsealed by removing the conforming elastomeric coating. In some examples, the conforming elastomeric coating may be mechanically peeled from the porous fixture. The removal of the conforming elastomeric coating may be performed chemically (e.g., via a chemical bath), manually pealing of the coating, or by an automated pealing of the coating (e.g., via robotic arms or the like), for example.

Processing may continue from operation 910 to operation 912, "REMOVE TUE GRAPHENE ON TARGET SUBSTRATE ASSEMBLY", where the graphene on target substrate assembly may be removed. For example, the graphene on target substrate assembly may be removed from the unsealed porous fixture. In some examples, during removal of the graphene on target substrate assembly from the fixture, solution permeable cover (e.g., permeable fabric 104 illustrated in FIG. 1) may fall free during disassembly of the porous fixture, as solution permeable cover may have poor adhesion to graphene. The result may be a substantially uniform and well bonded graphene on target substrate assembly. The removal of the graphene on target substrate assembly may be performed manually or be automated (e.g., via robotic arms or the like), for example.

In operation, process 900 may effectively transfer the layer of graphene to the target substrate by dissolving away the transition metal substrate and using hydrostatic pressure to form a substantially conforming bond between the layer of graphene and the target substrate. This transfer technique may eliminate using an intermediate polymer transfer film to transfer the layer of graphene from the transition metal substrate to the target substrate. Process 900 and/or 800 may be scaled and/or adapted to different sizes and shapes of the target substrate.

Figure 10:
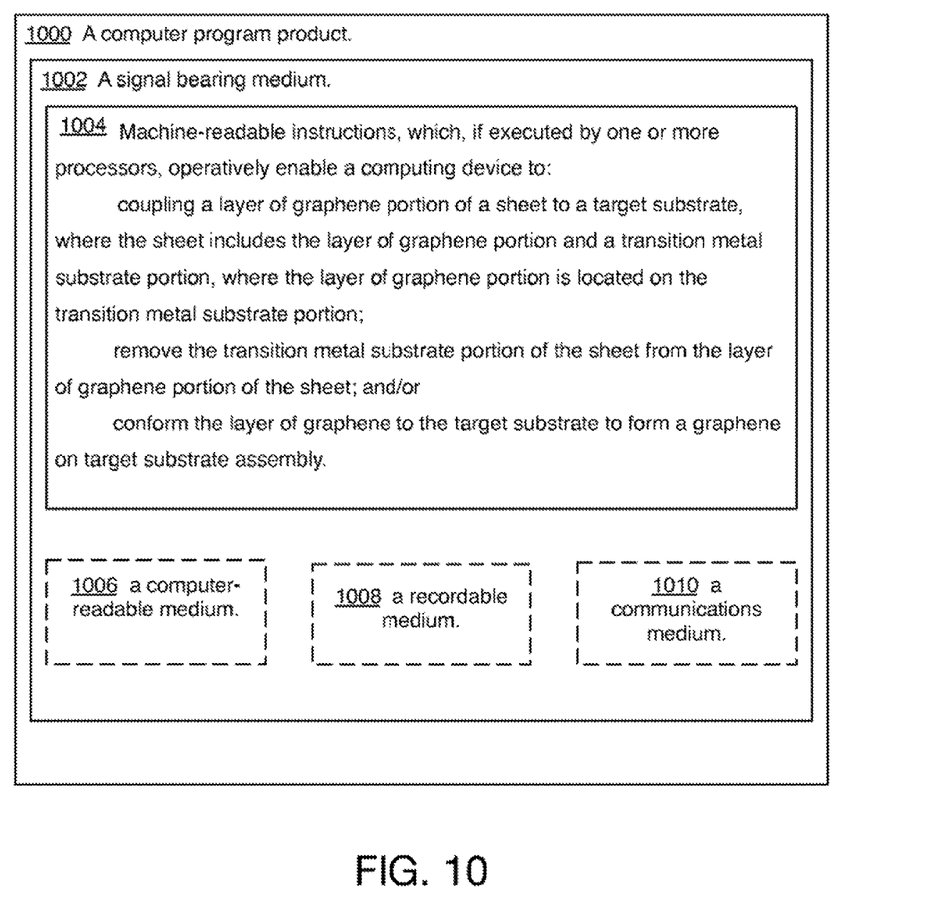
FIG. 10 is an illustration of an example computer program product.

FIG. 10 illustrates an example computer program product 1000 that is arranged in accordance with at least some examples of the present disclosure. Program product 1000 may include a signal bearing medium 1002. Signal bearing medium 1002 may include one or more machine-readable instructions 1004, which, if executed by one or more processors, may operatively enable a computing device to provide the functionality described above with respect to FIG. 8 and/or FIG. 9. Thus, for example, one or more computing devices may undertake one or more of the actions shown in FIG. 8 and/or FIG. 9 in response to instructions 1004 conveyed by medium 1002 to generate a graphene on target substrate assembly of FIG. 5 via the system of FIG. 1.

In some implementations, signal bearing medium 1002 may encompass a non-transitory computer-readable medium 1006, such as, but not limited to, a hard disk drive, a Compact Disc (CD), a Digital Versatile Disk (DVD), a digital tape, memory, etc. In some implementations, signal bearing medium 1002 may encompass a recordable medium 1008, such as, but not limited to, memory, read/write (R/W) CDs, R/W DVDs, etc. In some implementations, signal bearing medium 1002 may encompass communications medium 1010, such as, but not limited to, a digital and/or an analog communication medium (e.g., a fiber optic cable, a waveguide, a wired communications link, a wireless communication link, etc.).

Figure 11:
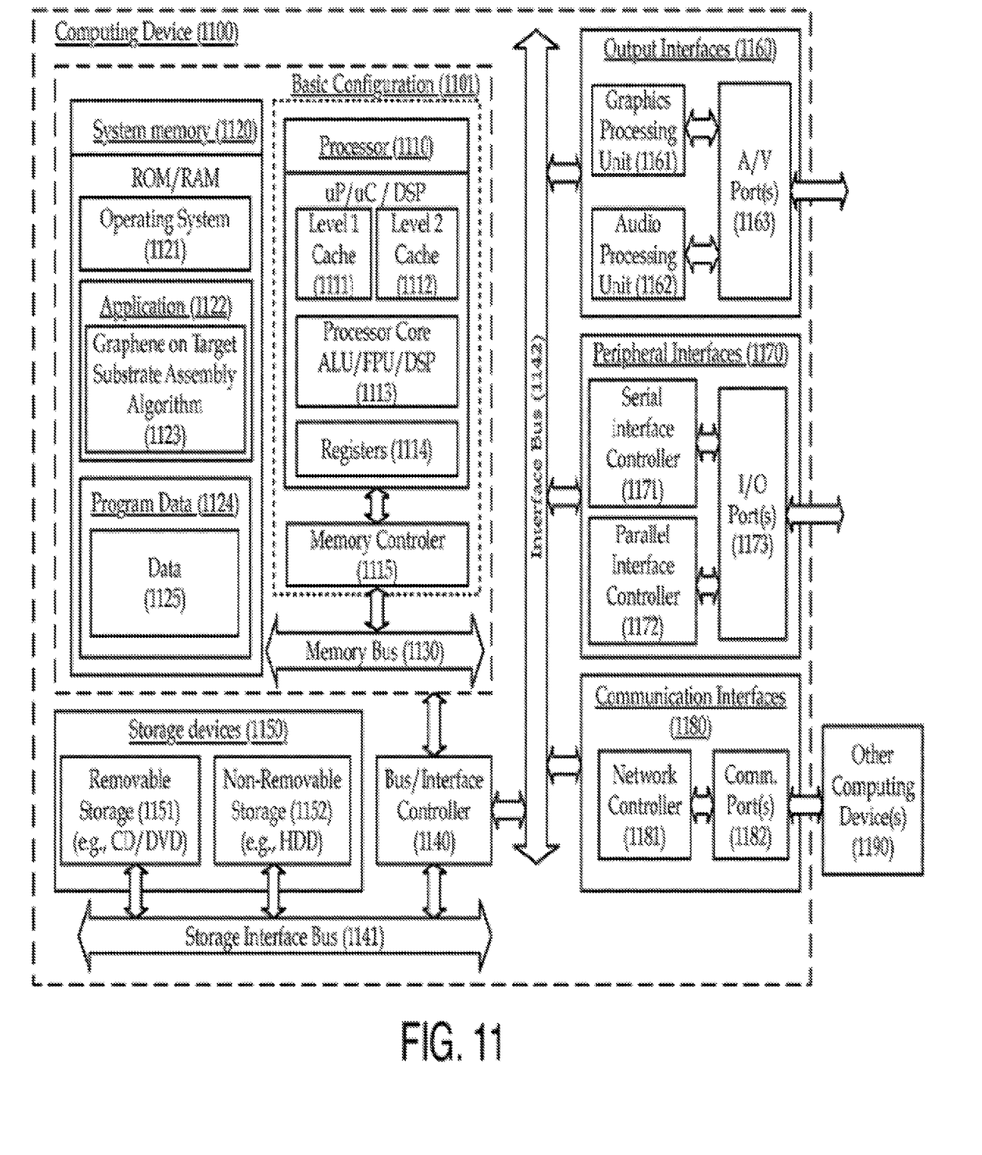
FIG. 11 is a block diagram illustrating an example computing device, all arranged in accordance with at least some embodiments of the present disclosure.

FIG. 11 is a block diagram illustrating an example computing device 1100, such as might be embodied by a person skilled in the art, which is arranged in accordance with at least some embodiments of the present disclosure. In one example configuration 1101, computing device 1100 may include one or more processors 1110 and system memory 1120. A memory bus 1130 may be used for communicating between the processor 1110 and the system memory 1120.

Depending on the desired configuration, processor 1110 may be of any type including but not limited to a microprocessor (μP), a microcontroller (μC), a digital signal processor (DSP), or any combination thereof. Processor 1110 may include one or more levels of caching, such as a level one cache 1111 and a level two cache 1112, a processor core 1113, and registers 1114. The processor core 1113 may include an arithmetic logic unit (ALU), a floating point unit (FPU), a digital signal processing core (DSP Core), or any combination thereof. A memory controller 1115 may also be used with the processor 1110, or in some implementations the memory controller 1115 may be an internal part of the processor 1110.

Depending on the desired configuration, the system memory 1120 may be of any type including but not limited to volatile memory (such as RAM), non-volatile memory (such as ROM, flash memory, etc.) or any combination thereof. System memory 1120 may include an operating system 1121, one or more applications 1122, and program data 1124. Application 1122 may include a graphene on target substrate assembly algorithm 1123 for conforming a layer of graphene to a target substrate that is arranged to perform the functions as described herein including the functional blocks and/or actions described with respect to process 800 of FIG. 8 and/or process 900 of FIG. 9. Program Data 1124 may include data 1125 for use with a graphene on target substrate assembly algorithm 1123. In some example embodiments, application 1122 may be arranged to operate with program data 1124 on an operating system 1121 such that implementations of conforming a layer of graphene to a target substrate may be provided as described herein. For example, one or more computing devices 1100 may be capable of performing all or a portion of application 1122 such that implementations of conforming a layer of graphene to a target substrate may be provided as described herein. This described basic configuration is illustrated in FIG. 11 by those components within dashed line 1101.

Computing device 1100 may have additional features or functionality, and additional interfaces to facilitate communications between the basic configuration 1101 and any required devices and interfaces. For example, a bus/interface controller 1140 may be used to facilitate communications between the basic configuration 1101 and one or more data storage devices 1150 via a storage interface bus 1141. The data storage devices 1150 may be removable storage devices 1151, non-removable storage devices 1152, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 1120, removable storage 1151 and non-removable storage 1152 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 1100. Any such computer storage media may be part of device 1100.

Computing device 1100 may also include an interface bus 1142 for facilitating communication from various interface devices (e.g., output interfaces, peripheral interfaces, and communication interfaces) to the basic configuration 1101 via the bus/interface controller 1140. Example output interfaces 1160 may include a graphics processing unit 1161 and an audio processing unit 1162, which may be configured to communicate to various external devices such as a display or speakers via one or more A/V ports 1163. Example peripheral interfaces 1160 may include a serial interface controller 1171 or a parallel interface controller 1172, which may be configured to communicate with external devices such as input devices (e.g., keyboard, mouse, pen, voice input device, touch input device, etc.) or other peripheral devices (e.g., printer, scanner, etc.) via one or more I/O ports 1173. An example communication interface 1180 includes a network controller 1181, which may be arranged to facilitate communications with one or more other computing devices 1190 over a network communication via one or more communication ports 1182. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 1100 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 1100 may also be implemented as a personal computer including both laptop computer and non-laptop computer configurations. In addition, computing device 1100 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the an will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity: control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone. B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method to conform graphene to a target substrate, the method comprising:
    placing a sheet and the target substrate in a housing, wherein the sheet includes a layer of graphene formed on a transition metal substrate, and wherein the layer of graphene of the sheet couples to the target substrate within the housing;
    passing an etchant solution through a permeable fabric located within the housing to remove the transition metal substrate from the layer of graphene;
    evacuating the housing to remove air between the layer of graphene and the target substrate;
    applying a conformal elastomeric coating to an exterior of the housing to seal the housing; and
    applying a hydrostatic pressure to conform the layer of graphene to the target substrate to form a graphene-on-target substrate assembly.

2. The method of claim 1, further comprising:
    forming the layer of graphene on the transition metal substrate by employing chemical vapor deposition.

3. The method of claim 1, further comprising:
    coupling the target substrate to the layer of graphene via local extremities of the target substrate.

4. The method of claim 3, wherein the local extremities are shaped with points that operate with Van der Waals forces to hold the target substrate in stable contact with the layer of graphene at the local extremities without full conformation of the layer of graphene to the target substrate.

5. The method of claim 3, wherein applying the hydrostatic pressure to conform the layer of graphene to the target substrate to form the graphene-on-target substrate assembly comprises:
    applying the hydrostatic pressure to substantially eliminate the local extremities.

6. The method of claim 1, further comprising:
    adjusting a temperature within the housing to facilitate conformation of the layer of graphene to the target substrate.

7. The method of claim 1, further comprising:
    unsealing the housing after the layer of graphene is conformed to the target substrate.

8. The method of claim 7, further comprising:
    removing the graphene-on-target substrate assembly from the unsealed housing.

9. A method to conform graphene to a target substrate, the method comprising:
    placing a sheet and the target substrate in a housing, wherein the sheet includes a layer of graphene formed on a transition metal substrate;
    coupling the layer of graphene of the sheet to the target substrate via local extremities of the target substrate within the housing, wherein the local extremities are shaped with points that operate with Van der Waals forces to hold the target substrate in stable contact with the layer of graphene at the local extremities with less than full conformation of the layer of graphene to the target substrate;
    passing an etchant solution through a permeable fabric located within the housing to remove the transition metal substrate from the layer of graphene;
    evacuating the housing to remove air between the layer of graphene and the target substrate; and
    applying a hydrostatic pressure to substantially eliminate the local extremities and conform the layer of graphene to the target substrate to form a graphene-on-target substrate assembly.

10. The method of claim 9, further comprising:
    applying a conformal elastomeric coating to an exterior of the housing to seal the housing.

11. The method of claim 10, further comprising:
    unsealing the housing after the layer of graphene is conformed to the target substrate.

12. The method of claim 11, further comprising:
removing the graphene-on-target substrate assembly from the unsealed housing.

13. A method to conform graphene to a target substrate, the method comprising:
placing a sheet and target substrate in a housing, wherein the sheet includes a layer of graphene located on a transition metal substrate;
coupling the layer of graphene of the sheet to the target substrate via local extremities of the target substrate within the housing, wherein the local extremities are shaped with points that operate with Van der Waals forces to hold the target substrate in stable contact with the layer of graphene at the local extremities with less than full conformation of the layer of graphene to the target substrate;
passing an etchant solution through a permeable fabric located within the housing to remove the transition metal substrate from the layer of graphene, wherein the permeable fabric is resistant to absorption of the etchant solution;
evacuating the housing to remove air between the layer of graphene and the target substrate;
applying a conformal elastomeric coating to an exterior of the housing to seal the housing to protect the target substrate from a fluid located outside of the housing; and
applying a hydrostatic pressure to the housing to substantially eliminate the local extremities and conform the layer of graphene to the target substrate to form a graphene-on-target substrate assembly.

14. The method of claim 13, further comprising:
providing the housing, wherein the housing includes a porous fixture.

15. The method of claim 13, further comprising:
selecting the transition metal substrate from among one or more of copper, nickel, iron, cobalt, platinum, iridium, and ruthenium.

16. The method of claim 13, further comprising:
selecting the target substrate from among one or more of a silicon dioxide based semiconductor, glass, quartz, a rigid polymer material, and a flexible polymer material.

17. The method of claim 13, further comprising:
selecting the permeable fabric such that the permeable fabric within the housing is resistant to adhesion to the layer of graphene in response to application of the hydrostatic pressure.

18. The method of claim 13, further comprising:
unsealing the housing after the layer of graphene is conformed to the target substrate; and
removing the graphene-on-target substrate assembly from the unsealed housing.

* * * * *

UNITED STATES PATENT AND TRADEMARK OFFICE
CERTIFICATE OF CORRECTION

| | | |
|---|---|---|
| PATENT NO. | : 9,868,641 B2 | Page 1 of 3 |
| APPLICATION NO. | : 15/071067 | |
| DATED | : January 16, 2018 | |
| INVENTOR(S) | : Yager | |

It is certified that error appears in the above-identified patent and that said Letters Patent is hereby corrected as shown below:

In Fig. 11, Sheet 9 of 9, "delete "uP/uC/DSP" and insert -- $\mu P/\mu C/DSP$ --, therefor. (See attached Sheet)

In Fig. 11, Sheet 9 of 9, for Tag "(1115)", Line 1, delete "Memory Controler (1115)" and insert -- Memory Controller (1115) --, therefor.

In Fig. 11, Sheet 9 of 9, for Tag "(1171)", Line 1, delete "Serial interface Controller (1171)" and insert -- Serial Interface Controller (1171) --, therefor.

In Column 4, Line 33, delete "metal substrate 202" and insert -- metal substrate 204 --, therefor.

In Column 9, Line 54, delete "TUE GRAPHENE" and insert -- THE GRAPHENE --, therefor.

In Column 10, Line 13, delete "Program product 1000" and insert -- Computer program product 1000 --, therefor.

In Column 10, Line 22, delete "medium 1002" and insert -- signal bearing medium 1002 --, therefor.

In Column 10, Line 26, delete "hard disk drive," and insert -- hard disk drive (HDD), --, therefor.

In Column 10, Line 35, delete "communications link," and insert -- communication link, --, therefor.

In Column 10, Line 41, delete "configuration 1101," and insert -- basic configuration 1101, --, therefor.

In Column 10, Line 55, delete "some implementations" and insert -- some implementations, --, therefor.

In Column 11, Line 44, delete "device 1100." and insert -- computing device 1100. --, therefor.

Signed and Sealed this
Twenty-fourth Day of April, 2018

Andrei Iancu
*Director of the United States Patent and Trademark Office*

CERTIFICATE OF CORRECTION (continued)
U.S. Pat. No. 9,868,641 B2

In Column 11, Line 54, delete "interfaces 1160" and insert -- interfaces 1170 --, therefor.

In Column 13, Lines 63-64, delete "communications link," and insert -- communication link, --, therefor.

In Column 14, Line 5, delete "the an will" and insert -- the art will --, therefor.

In Column 14, Line 15, delete "velocity: control" and insert -- velocity; control --, therefor.

In Column 14, Line 60, delete "recitation no" and insert -- recitation, no --, therefor.

In Column 15, Line 11, delete "of"two" and insert -- of "two --, therefor.

In Column 15, Line 15, delete "general such" and insert -- general, such --, therefor.

In Column 15, Line 23, delete "general such" and insert -- general, such --, therefor.

In Column 15, Line 42, delete "of"an" and insert -- of "an --, therefor.

In Column 17, Line 6, in Claim 13, delete "and target" and insert -- and the target --, therefor.